(12) United States Patent
Kushmaro et al.

(10) Patent No.: US 6,701,139 B1
(45) Date of Patent: Mar. 2, 2004

(54) CODE CONVERTER AND A SYSTEM USING SAME

(75) Inventors: Lior Kushmaro, Holon (IL); Joshua Piasecki, Ramat-Gan (IL)

(73) Assignee: Veraz Networks Ltd., Petach-Tikva (IL)

(*) Notice: Subject to any disclaimer, the term of this patent is extended or adjusted under 35 U.S.C. 154(b) by 0 days.

(21) Appl. No.: 09/506,578

(22) Filed: Feb. 18, 2000

(30) Foreign Application Priority Data

Feb. 21, 1999 (IL) ................................................ 128625

(51) Int. Cl.$^7$ .................................................. H04B 1/18
(52) U.S. Cl. ...................... 455/131; 455/22; 455/236.1; 375/219; 375/220; 370/595
(58) Field of Search ................................ 455/131, 132, 455/403, 550, 414.4, 22, 236.1, 323; 375/240, 240.03, 219, 220, 328; 370/545, 543, 189.1, 190.1, 311

(56) References Cited

U.S. PATENT DOCUMENTS

| | | | | |
|---|---|---|---|---|
| 5,380,993 A | * | 1/1995 | Komai | 235/462.01 |
| 5,867,493 A | * | 2/1999 | Zisapel | 370/351 |
| H001880 H | * | 10/2000 | Vines et al. | 370/310 |
| 6,512,790 B1 | * | 1/2003 | Sourani | 375/240 |

* cited by examiner

*Primary Examiner*—Cong Van Tran
(74) *Attorney, Agent, or Firm*—Nath & Associates PLLC; Harold L. Novick

(57) ABSTRACT

A converter operative in a digital telecommunication system to receive signals coded at a first compression mode and convert them into a second compression mode. The conversion provided, leads to substantially less impairments in the decompressed form of the signals converted into the second compression mode, had the signals received been decompressed from the first compression mode into their decompressed form followed by compressing these decompressed signals into the second compression mode, and decompressing the signals thus obtained.

4 Claims, 3 Drawing Sheets

CODE CONVERTER AND A SYSTEM USING SAME

FIELD OF THE INVENTION

The present invention relates to telecommunication systems in general, and in particular to the transmission of compressed signals in telecommunication systems.

BACKGROUND OF THE INVENTION

Telecommunication has moved in the recent years towards digital networks carrying voice, facsimile and other signals. One known way in the art to increase the efficiency of such networks is to transmit the signals in a compressed form, thus using the available bandwidth for simultaneous transmission of more information.

U.S. Pat. No. RE 35,740 discloses a system for carrying voice, facsimile and non-facsimile voice band data. This system includes various compressing mechanisms and offers an improved detection of facsimile signals. Still, when speech, facsimile and other signals are subjected to several compression/decompression cycles, their quality degrades substantially, and at times, the signals may be received at a quality and delay that are unacceptable.

Some methods were suggested in the past to overcome this handicap. Cox et al., in International Conference on Communications, Vol. 1, June 1998, pp. 90–95, suggest a method to decrease the distortion and delay introduced while using low rate speech coding. It was suggested there that the receiving module, the compressor, searches the less significant bits of the input 64 Kb/s mu-law coded stream for the synchronization pattern. If it detects the pattern, it temporarily squelches the compressed signal and enables the de-compressor to begin padding rather than decoding. When the de-compressor is padding the low-rate frame, a new synchronization pattern is inserted into one of the non-used bits. When the far end compressor detects this new synchronization pattern it disables the squelch on its compressor and begins stripping the padded bits. However, when the compressor at the receiving end does not find the "robbed" less significant bits synchronization pattern in the 64 Kb/s stream, it will not proceed to the pad and strip state, and the de-compressor will insert the robbed bit synchronization pattern into the 64 Kb/s stream, transmitted to the subscriber. One way of increasing the rate of the low rate bit stream suggested in this publication is, by inserting the low rate signal into the least significant bits of the mu-law word of the 64 Kb/s stream. The advantage of using such a method is that if by any change the system treats the signal as mu-low coded speech, only low level noise signal would be noticed by the human listener.

Our co-pending application, U.S. Ser. No. 09/465,456 filed Dec. 17, 1999, describes a digital telecommunication station adapted to receive different types of signals, detecting and identifying their type and allows handling the incoming signals in an end-to-end mode of operation. By this mode, the signals can be transmitted through a number of compressing/decompressing devices, thus retaining them in their compressed form and only decompress them into their digital de-compressed output signals only at the most downstream compressing/decompressing device.

Still, there are other cases where signals are transmitted via a number of different types of compressing/decompressing devices located along the transmission path. The common way used in the art to handle these cases, is, if the next leg along the transmission's path does not have the capability of decompressing this type of compressed transmission, then the signal is decompressed and transmitted via this next leg in its non-compressed form. Once the transmission is received at the receiving end of the this next leg, the non-compressed transmission may be compressed again (provided of course that there is at least one further decompressing means operative along the transmission path) by using the algorithm prevailing in that part of the transmission path. Naturally, this type of operation has a significant impact on the quality of the signals.

As an example of a process suffering from this drawback, let us consider a voice call between two cellular telephone users. In this example, each user is connected to a different cellular network each using a different type of compressing algorithm. When the voice call is transmitted from the first transmitting mobile station, the signals are transformed into a digital transmission representing the voice signals, and compressed by say the full rate GSM algorithm (about 13.8 kbit/s). Other processes in turn change this digital information into a radio signal.

After being detected by a base station antenna, the signals are processed and the digital signals representing the voice, which are delivered to a speech transcoder are recovered therefrom. By this example, the two end networks operate each at a different compression rate, thus, the encoded transmission received from the transmitting end will be decompressed by the transcoder to a rate of 64 Kbit/s, and be routed through the Mobile services Switching Center ("MSC") and various links and switches towards the receiving end network. There, the transmission will be compressed again in accordance with the operating coding algorithm used in that second network, say the half rate GSM algorithm, and be transmitted to the receiving mobile station by the reverse process of the one described above. In reality, such a process may be more complicated than that described above. For example, the transmission path may further comprise PSTN links that include one or more pairs of compressing/decompressing devices. In this latter case, the transmission will be subjected to one or more additional compressing/decompressing cycles. The end result of such a process, is a very poor call quality with highly distorted signals. In order to retain a good quality of service, it would be highly beneficial to minimize the number of these compressing/decompressing cycles, as each of them deteriorates the signals quality.

A similar problem exists in the solution suggested in U.S. Pat. No. 4,890,282. This patent discloses a network wherein the mode of the speech compression in a channel carrying speech information is determined by the ports through which it is transmitted. Once the link across which data will be transmitted, is determined, the mode of data compression is determined. By the embodiments described in U.S. Pat. No. 4,890,282, the compression may be conducted either by using the digital speech interpolation (DSI) algorithm, or alternatively the AD-PCM algorithm. Once a neighboring node to which the call is to be forwarded informs the sending node that it does not have decompression resources needed to process the call, the sending node decompresses the signal, and transmit it in its decompressed form (at the rate of 64 kbit/s). As would be appreciated such solution does not solve the problem at hand, being how to reduce the number of compression/decompression cycles along the transmission path.

The present invention is therefore directed to overcome such problems, and to provide a way of forwarding the transmission along a transmission path, essentially in a compressed form.

SUMMARY OF THE INVENTION

It is therefore an object of the present invention to provide a telecommunication converter for converting signals received coded at a first code, into signals coded at a second code.

It is another object of the present invention to provide a novel digital communication system having a good quality of the signals transmitted.

Yet another object of the present invention is to provide a method for converting signals coded according to a first coding algorithm, into signals coded by another one.

Further object and features of the invention will become apparent to those skilled in the art, from the following description and the accompanying drawings.

In accordance with the present invention there is provided a converter operative in a digital telecommunication system to receive signals coded at a first compression mode and convert them into a second compression mode, which conversion leads to substantially less impairments in the decompressed form of the signals converted into the second compression mode, had the signals received been decompressed from the first compression mode into their decompressed form followed by compressing these decompressed signals into the second compression mode, and decompressing the signals thus obtained.

According to a preferred embodiment of the invention, the compressed forms are derived from operating a GSM compressing algorithm on the transmitted signals.

Typically, such algorithms are GSM full rate (at about 13.8 kbit/s), GSM half rate (at about 6.7 kbit), GSM enhanced rate (at about 13.8 kbit/s), and the like.

In accordance with a preferred embodiment of the present invention, the converter provided is operative to receive signals coded at a first compression mode and convert them into a second compression mode, obviating the need for decompressing the compressed signals into their de-compressed form during conversion.

According to another preferred embodiment, the digital telecommunication station of the invention is operative to receive at least two different types of signals and comprises:

at least one detector operative to receive signals and determine their type;

at least one switch controlled by the at least one detector, operative to channel the signals in accordance with the determination of their type;

a first identifier for determining whether the signals received are of a digital compressed form;

at least one converter operative to convert the signals coded at a first compression mode received, into a second compression mode; and at least two pairs of different compressing/decompressing devices.

In accordance with a preferred embodiment of the invention, the digital telecommunication station further comprises a second identifier for determining the type of the coding algorithm applied for compressing the signals received to their first coded form.

The different types of signals are preferably selected from the group consisting of voice signals, fax signals, data signals, voice band data signals and video signals. More preferably, the signals received at the digital communication station of the present invention include at least voice and fax types of signals.

In accordance with the present invention, the pairs of compressing/decompressing devices, are preferably selected from the following group:

encoder/decoder adapted to receive a voice signal and operate thereon;

modulator/demodulator adapted to receive a facsimile signal and operate thereon;

encoder/decoder adapted to receive a data signal and operate thereon;

voiceband data modulator/demodulator adapted to receive a voiceband data signal and operate thereon; and video encoder/decoder adapted to receive a video signal and operate thereon.

In accordance with yet another preferred embodiment, the digital telecommunication station of the invention further comprises a third identifier for determining whether the transmission path to which the digital telecommunication station is connected, includes at least one further operative means adapted for decompressing signals when being transmitted in their compressed form. More preferably, the digital telecommunication station further comprises first transmission means operative (in response to a determination made by the third identifier that said transmission path does not include at least one further operative means adapted for decompressing the signals being transmitted in their compressed form, and second transmission means operative in response to a determination made by said second identifier that said transmission path does include at least one further operative means adapted for decompressing the signals being transmitted in their compressed form into the decompressed digital output signals.

One of the main functions that may be carried by the second identifier is, determining the type of the coding algorithm used in compressing the signals to their first compression mode. As known in the art, messages such as handshake messages, may or may not comprise an indication of the type of the coding algorithm used in the compression of that transmission. If such an indication is indeed included in the message received, obviously the second identifier will not be utilized for that purpose. However, if no information is transmitted to the telecommunication station identifying the type of the coding algorithm used in compressing the transmitted signals, this second identifier will be used to provide the indication of the type of the coding algorithm applied.

According to another aspect of the invention there is provided a digital communication system for interconnecting a plurality of telecommunication trunks via transmission paths wherein a transmission coded at a first compression mode and converted into a second compression mode, characterized in that when the transmission's converted signals are decompressed into their de-compressed form, the impairments intensity of the de-compressed signals received is substantially lower than had the de-compressed signals received been decompressed from their first compression mode into their decompressed form, and then compressed from their decompressed form into the second compression mode prior to their second de-compression.

According to a preferred embodiment of the invention, the transmission path comprises at least two cellular network nodes.

According to still another preferred embodiment, the system of the invention comprises:

first transmission means at at least a first end of the transmission network for transmitting digital signals;

at least one pair of telecommunication stations of the type specified;

at least one further means adapted for decompressing signals being transmitted in their compressed form; and receiving means at at least a second end of the transmission network.

The term "telecommunication network", as will be used hereinafter, should be understood to encompass the various types of networks known in the art, such as cellular networks, TDM networks, synchronous and asynchronous transfer networks, IP networks, frame relaying networks or any other applicable packet communication networks.

As previously explained, the term "telecommunication station" is used herein to describe a combination of at least two "compressing/decompressing" devices and at least one converter. One of the compressing/decompressing devices is used for compressing signals received, while the other is used as its corresponding de-compressor. These two devices may be included within one apparatus or be separated from each other. Also the telecommunication station of the invention comprises at least one converter for converting signals coded in a first form to signals coded in a second form when required. Obviously, such a station may comprise more than one such converter, e.g. for use in simultaneous conversion of transmissions, transmitted in both upstream and downstream directions.

A "normal compression mode" of a pair of such telecommunication stations as will be referred to hereinafter, is used to denote a mode of operation in which the incoming digital signals received by a first station are either compressed by the station's compressing/decompressing device or converted by its converter from a first compression mode to a second compression mode, and transmitted in their thus obtained compressed mode to a de-compressing device (the de-compressor) of the second station of the pair of telecommunication stations. In that second station, decompression is carried out essentially by converting the digital signals received into their non-compressed form.

Typically, the information signals received may either be compressed by the station's compressing/decompressing device (e.g. when received in their non-compressed form) or converted by the station's converter from a first compression mode to a second compression mode. The signals are then transmitted in their newly compressed form towards the next telecommunication station along the transmission path. However, there is a further alternative to this mode of operation. By this alternative, even when signals are received in their first compression mode and should be converted into a second compression mode by the end of the transmission path, still, the conversion does not necessarily take place at the first telecommunication station along the transmission path, but can take place at some later state, as will be further explained. There could be various reasons for wishing to delay the conversion. One example is bandwidth availability. Another example could be the transmission path, as one station may have to transmit the signals towards a number of receiving ends, each of which may use a different compressing algorithm, thus the decision in which station to convert the signals may depend upon the structure of the transmission path/network structure. In the case that there is at least one further operative means for decompressing signals along the transmission path which comprises a pair of telecommunication stations, the transmission will be routed via the first station of the second pair towards the second station of the second pair where it will be processed in accordance with the operative means in the remaining part of the transmission path. For example, decompression may then be carried out, provided that the third identification means of that second station of the second pair of telecommunication stations determines that no other operative de-compressing device is operative downstream of that second station. Such mode of operation will be referred to hereinafter as "end-to-end compression".

According to a further preferred embodiment of the present invention, the system provided by the invention further comprises means for determining the mode of operation of facsimile signals. More preferably, the first transmission means also comprises transmission means for transmitting an indication of the mode of operation of the facsimile signals over the transmission path/network and towards the receiving means.

In accordance with yet another preferred embodiment of the invention, a pair of telecommunication stations in the communications system, are selectively operated.

According to another embodiment of the present invention, the system further includes message generation and detection means operative to detect messages transmitted by the first transmitting means.

By a further embodiment of the present invention, at least one of the digital telecommunication stations in the digital communication system is further provided with an option of establishing a communication connection with more than two other digital telecommunication stations. Preferably, such a station is adapted to establish a communication with a plurality of digital telecommunication stations, each located at a different end of a telecommunication network. By another embodiment of the present invention, a full or part of a transmission sent by at least one of the telecommunication stations in the digital communication system may be received in parallel by at least two other digital telecommunication stations.

According to yet another aspect of the present invention there is provided a method for use in a digital communication system for converting signals received in a first compression mode into a second compression mode, so that when the converted signals are decompressed into their de-compressed form, the impairments introduced due to the conversion into the second compression mode are substantially less than had the signals decompressed into their de-compressed form been decompressed from their first compression mode into their decompressed form, and then compressed from their decompressed form into the second compression mode.

According to a preferred embodiment of this aspect of the invention, the method comprises:
  i. transmitting a message identifying the type of signals to be transmitted and their destination;
  ii. establishing a transmission path for communication between the first transmitting means and a receiving means at the transmission destination;
  iii. exchanging signals between a first telecommunication station and a second telecommunication station identifying, for each one of them the rate used to transmit information signals therebetween;
  iv. converting information signals received in a first compression mode to information signals coded in a second compression mode;
  v. transmitting information signals at their converted coded form;
  vi. transmitting a message denoting the end of transmission; and
  vii. disconnecting the communication between the first transmitting means and the receiving means.

As previously described, the transmission path may include more than one pair of telecommunication stations, in which case a similar procedure of "hand-shaking" as described in step (iii) above, will be carried out for each two pairs of consecutive stations.

According to another preferred embodiment, the decision when the conversion of the compressed signals from their first compression mode to their second compression mode should be carried is taken according to the transmission path established. Such a decision may for example be taken dynamically in accordance with bandwidth availability. Therefore, it should be understood that steps (iv) and (v) for example, of the above described method may be reversed so that the transmitted signals are in their first compression mode, and only later are converted into their second compression mode. Various modifications of the method described will be apparent to those skilled in this, art and the scope of the invention should be understood to encompass also any equivalent of the above described matter.

According to yet another embodiment of the present invention there is provided a method for use in a digital communication system for interconnecting a plurality of telephone communication trunks, carrying at least two different types of signals, via a transmission path including a first and a second operative pairs of telecommunication stations, which method comprises:

i. transmitting a message identifying the type of signals to be transmitted and their destination;
ii. establishing a transmission path for communication between the first transmitting means and a receiving means at the transmission destination;
iii. exchanging signals between a first telecommunication station and a second pair of telecommunication stations identifying, for each one of them the existence of the other and the rate used by each of the station to transmit information signals therebetween;
iv. converting information signals received in a first compression mode to information signals coded in a second compression mode;
v. transmitting information signals at their converted coded form;
vi. transmitting a message comprising a characterization of the signals to follow;
vii. transmitting information signals at their converted coded form;
viii. transmitting a message denoting the end of transmission; and
ix. disconnecting the communication between the first transmitting means and the receiving means.

A preferred embodiment in carrying out the method provided by the invention, is to further conduct a periodic check to confirm that at least one further means for decompressing signals being transmitted in their compressed form is still operative along the transmission path. Therefore, when a station becomes the only decompressing operative means along that path, it will immediately resume its de-compression mode, and the pair of telecommunication stations will begin operation under normal operating mode. According to a further embodiment of the present invention, prior to disconnecting an operative decompressing means from the transmission path to which it is connected, a message declaring the expected disconnection of that operative compressing means is sent. When such a message is received by the neighboring telecommunication stations, each one of them will immediately resume its normal operating mode. According to a more preferred embodiment of the invention, all pairs of telecommunication stations operating along the transmission path periodically transmit their integrity signals. Once a pair of stations does not receive the integrity signal of its neighboring downstream pair of stations, it will automatically resume the operating mode.

DETAILED DESCRIPTION OF THE INVENTION

Figure 1:
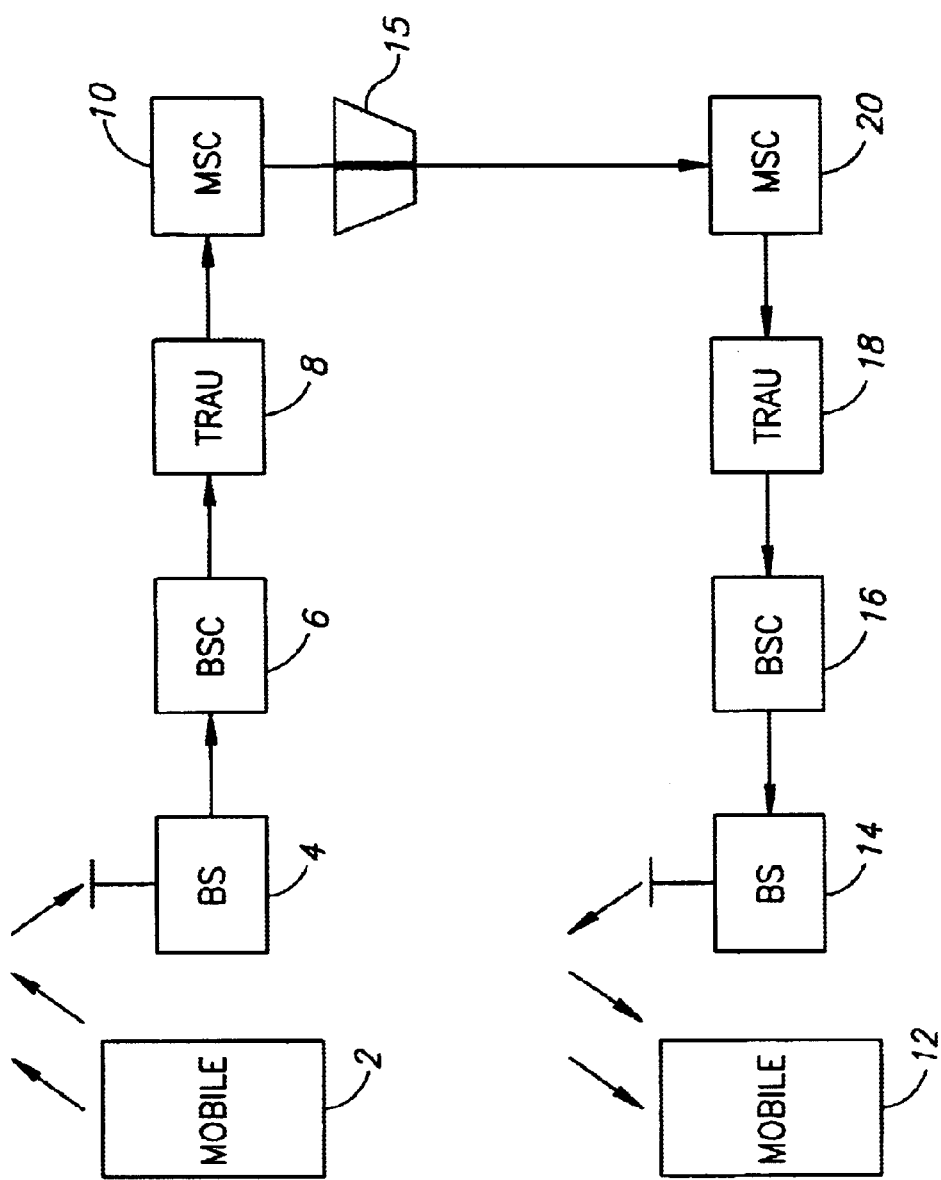
FIG. 1 describes schematically a network comprising the converter of the present invention and two different cellular networks.

Let us now turn to the Figures. FIG. 1 demonstrates a case where a call is transmitted from a cellular network (2, 4, 6, 8 and 10) in which one coding algorithm is used, to another cellular network (12, 14, 16, 18 and 20) in which a different coding algorithm is used. In this case, the change from one coding mode to the other, is made in converter 15 which converts the coding of the signals received to a mode acceptable in the second cellular network. As previously explained, the conversion according to the present invention results in substantially less impairments in the decompressed form of the converted signals, than had the signals received at the receiving end been decompressed from their first compression mode into their decompressed form, and then compressed into the second compression mode, before their second decompression into their de-compressed mode and received by the receiving means.

Figure 2:
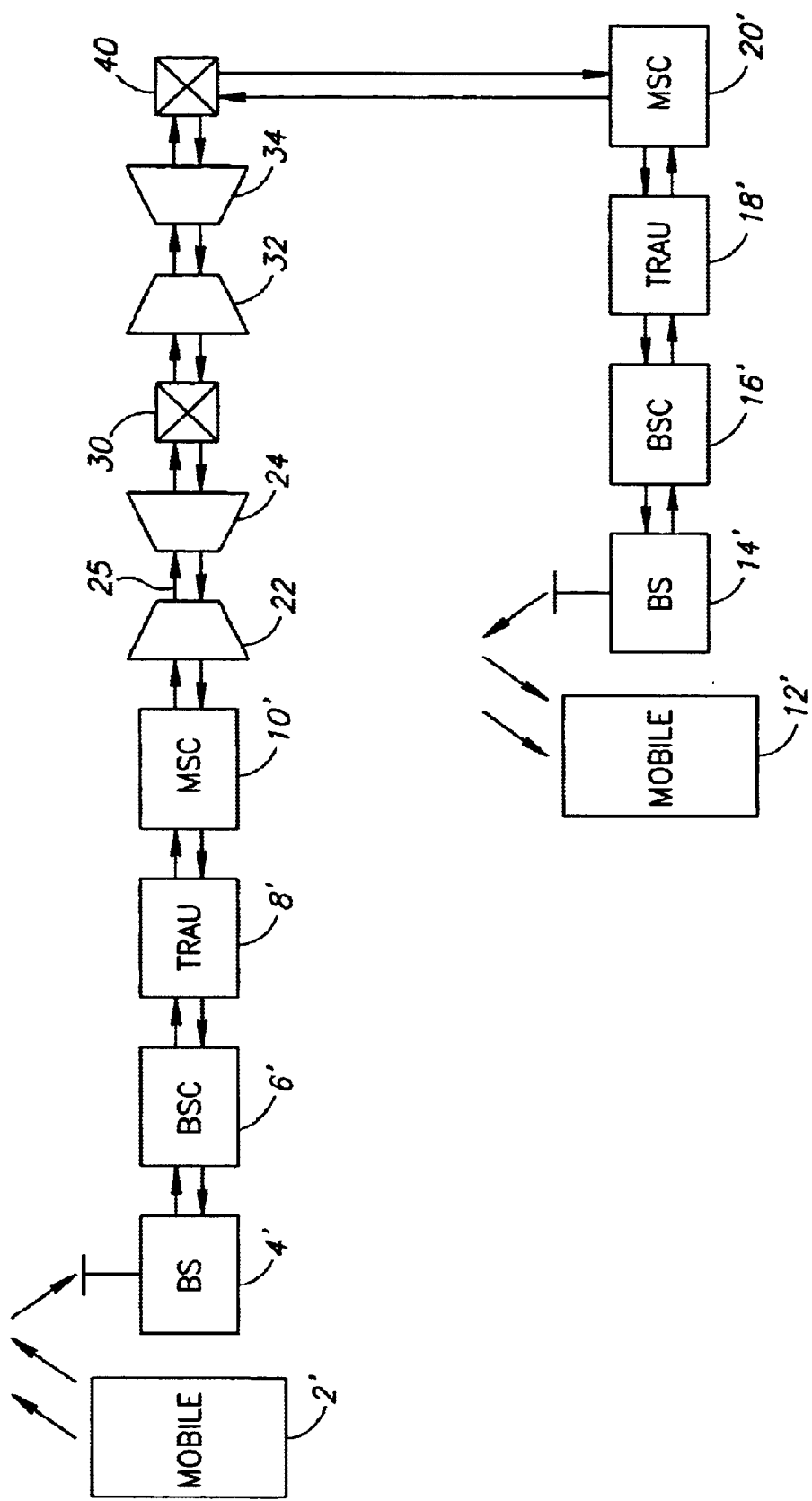
FIG. 2 demonstrates schematically a network comprising a system of the present invention connecting two different cellular networks, via a PSTN network.

FIG. 2 presents a communication network comprising transmitting/receiving mobile units (2' and 12') and a network connecting therebetween. The network shown in this Figure, comprises two cellular networks (4' to 10' and 14' to 20') two pairs of telecommunication stations 25 and 35, each comprising a pair of compressing/decompressing stations, 22 and 24 and 32 and 34, respectively, as well as PSTN communication exchanges (30 and 40). Certain examples demonstrating the system operation are described hereinbelow and may be used for better understanding FIG. 2.

Figure 3:
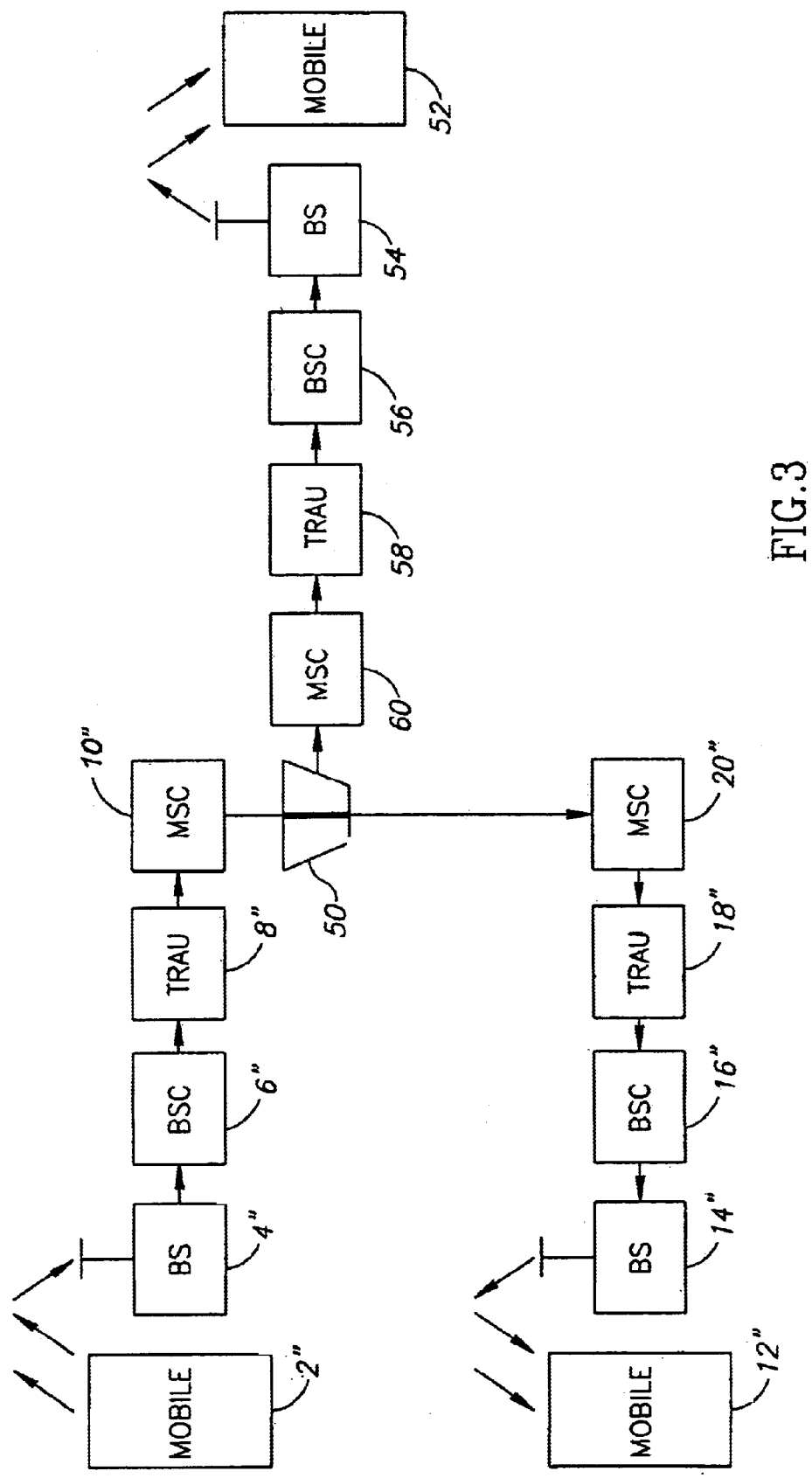
FIG. 3 illustrates a further embodiment of the present invention.

FIG. 3 illustrates some further embodiments of the invention. In the Fig there is a converter 50 of the present invention, operative to allow transmissions to two networks (2", 4", 6", 8" and 10") and (12", 14", 16", 18" and 20"), each operating according to its own compression algorithm.

One typical way this setup may be operated is as follows. A transmission is received from network (52, 54, 56, 58 and 60) at converter 50 coded in a first compression mode, and is designated to be transmitted to both networks (2", 4", 6", 8" and 10") and (12", 14", 16", 18" and 20"). If in both these networks the operative algorithm is the same second algorithm which is different than the first algorithm operative at network (52, 54, 56, 58 and 60), the signals will be converted by converter 50 from their compression mode according to the first algorithm, to another compression mode which is adapted to the second compression algorithm of networks (2", 4", 6", 8" and 10") and (12", 14", 16", 18" and 20").

As should be appreciated by a man skilled in the art, this embodiment may be carried in a variety of ways. One example of such a variant is, when in each one of networks (2", 4", 6", 8" and 10") and (12", 14", 16", 18" and 20"), another compression algorithm is operative. In such a case, the signals to be converted, may either be converted simultaneously according to the two downstream algorithms, or consecutively, by storing a duplication of the transmission in a buffer which the converter of the invention may be provided with. Further types of operating digital telecommunication stations in tandem are also possible, and it should be understood that they are all encompassed by the present invention.

The following non-limiting examples will demonstrate various embodiments of the present invention.

EXAMPLES

Example 1

Let us now consider an example where a voice call is to be transmitted from a mobile transmitting means 2 to receiving means 12, in the network exemplified in FIG. 1.

The call is generated by a mobile transmitting means 2. The voice signal is transformed into a digital information stream by the full rate GSM algorithm, representing the speech signals having about 13.8 kbit/s rate. Other processes will then change these digital signals into a high frequency analog signals transmitted over the air. After being detected by a case station ("BS") 4 (via its antenna), this signal is processed to recover therefrom the digital signal representing the speech, and transmitted via the Base Station Controller ("BSC") 6 through Transcoder and Rate Adapter Unit (TRAU) 8, where, contrary to the way common in the art, no decompression takes place. The coded signal is then routed through the Mobile services Switching Center (MSC) 10 and various links and switches as may be required, to station 15 operating as a converter. Since the transmission is received compressed at a rate of 13.8, whereas the coding algorithm of the downstream network is half rate GSM algorithm (about 6.7 kbit/s), converter 15 will convert the transmission into the corresponding downstream rate, and the thus converted transmission will be forwarded via MCS 20, TRAU 18, BSC 16 and BS 14 to mobile station 12, where it will be decompressed.

The reversed direction is not demonstrated in the Fig., but it is practically similar to the process described above mutatis mutandis. The major change is that converter 15 will now convert the coded transmission from half rate to full rate.

Example 2

Let us now consider an example where a voice call is to be transmitted from transmitting means 2' to receiving means 12', in the network exemplified in FIG. 2 Again, the call is generated by a mobile transmitting means 2', and be routed similarly to the description given in Example 1, towards a pair 25 of telecommunication stations 22 and 24. From pair 25, the transmission is routed via exchange 30 to pair 35 of telecommunication stations 32 and 34, and thereafter via exchange 40 to another cellular network (12', 14', 16', 18' and 20') where the half rate GSM algorithm is operative.

As may be appreciated by a man skilled in the art, the conversion from full rate GSM to half rate GSM may be carried out by any one of the suitable various devices operative along the transmission path illustrated (22, 24, 32 or 34). One option to determine where the conversion will be carried is according to bandwidth availability. Another option is that the conversion will be carried by that station which identification means do not identify any further operative means along the transmission path which are capable of carrying out the conversion form the first compression mode to the second compression mode. Obviously, other choices may also be made, e.g. making use of predetermination of a prevailing algorithm etc. All these options should be understood to be encompassed by the present invention.

It is to be understood that the above description and examples only include some embodiment of the invention and serves for its illustration. Other variants such as transmission of fax signals, data signals, voiceband data signals or video signals, compressed in conformity with one algorithm and transmitted to a destination where another compression algorithm prevails, are also possible and are within the scope of the present invention. Furthermore, numerous other ways of managing various types of compressed signals in telecommunication networks may be devised by a person skilled in the art without departing from the scope of the invention, and are thus encompassed by the present invention.

What is claimed is:

1. A method for use in a digital communication system for converting signals received in a first compression mode into a second compression mode, so that when the converted signals are decompressed into their de-compressed form, the impairments introduced due to the conversion into the second compression mode are substantially less than had the signals decompressed into their de-compressed form been decompressed from their first compression mode into their decompressed form, and then compressed from their decompressed form into the second compression mode, which method comprises the steps of:

i. transmitting a message identifying the type of signals to be transmitted and their destination;

ii. establishing a transmission path for communication between the first transmitting means and a receiving means at the transmission destination;

iii. exchanging signals between a first telecommunication station and a second telecommunication station identifying, for each one of them the rate used to transmit information signals therebetween;

iv. converting signals received in a first compression mode to signals coded in a second compression mode;

v. transmitting said signals at their converted coded form;

vi. transmitting a message denoting the end of transmission; and vii. disconnecting the communication between the first transmitting means and the receiving means.

2. A method according to claim 1, wherein the decision on when to carry out the conversion of the compressed signals from their first compression mode to their second compression mode, is taken in accordance with the transmission path established.

3. A method according to claim 1, wherein signals that are received in said first compression mode comprise a combination of compressed and non-compressed parts, and signals coded in said second compression mode comprise at least a further compressed part that is substantially identical when decompressed from the second compression mode to the non-compressed part of corresponding signals received in said first compression mode.

4. A method according to claim 3, wherein said signals that are received in said first compression mode and comprise a combination of compressed and non-compressed parts, are signals compressed in accordance with the GSM enhanced rate.

* * * * *